(12) United States Patent
Huang et al.

(10) Patent No.: US 6,570,145 B2
(45) Date of Patent: May 27, 2003

(54) PHASE GRATING IMAGE SENSING DEVICE AND METHOD OF MANUFACTURE

(75) Inventors: Chin-Wen Huang, Wu-Jih Hsiang (TW); Jian-Bin Shiu, Hsinchu (TW); Ching-Ming Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 106 days.

(21) Appl. No.: 09/847,684

(22) Filed: May 2, 2001

(65) Prior Publication Data

US 2002/0162944 A1 Nov. 7, 2002

(51) Int. Cl.[7] .............................................. H01L 27/00
(52) U.S. Cl. .................................... 250/208.1; 250/226
(58) Field of Search ......................... 250/208.1, 208.2, 250/214.1, 214 R, 216, 226, 237 G, 237 R; 257/432, 452, 466; 438/71, 78, 65, 66

(56) References Cited

U.S. PATENT DOCUMENTS

| 4,539,482 A | * | 9/1985 | Nose | 250/208.1 |
| 5,699,185 A | * | 12/1997 | MacDonald et al. | 348/834 |
| 5,812,629 A | * | 9/1998 | Clauser | 378/37 |
| 6,171,885 B1 | * | 1/2001 | Fan et al. | 438/70 |
| 6,252,216 B1 | * | 6/2001 | Ohashi | 250/208.1 |

* cited by examiner

Primary Examiner—Que T. Le
Assistant Examiner—Thanh X. Luu
(74) Attorney, Agent, or Firm—J. C. Patents

(57) ABSTRACT

A phase grating image-sensing device. The device includes a plurality of photodiodes, a smoothing layer, a color filter layer and a plurality of phase gratings. The photodiodes are formed on a substrate and isolated from each other by isolation structures. The smoothing layer covers the photodiodes and the isolation structures. The color filter layer is embedded within the smoothing layer forming a sandwich structure with the smoothing layer. The phase gratings are formed over the smoothing layer positioned at corresponding locations above isolation structures. The phase grating layers produce a constructive interference of light passing through the smoothing layer.

27 Claims, 4 Drawing Sheets

PHASE GRATING IMAGE SENSING DEVICE AND METHOD OF MANUFACTURE

BACKGROUND OF THE INVENTION

1. Field of Invention

The present invention relates to an image sensing device and its method of manufacture. More particularly, the present invention relates to a phase grating image sensing device and its method of manufacture.

2. Description of Related Art

An image-sensing device operates by converting incoming light falling upon an array of diodes into a quantity of photoelectrons. This array of diodes resembles pixels on a display panel. Each diode generates a quantity of electric charges according the intensity of light projected onto the image-sensing device. In general, incoming light passes through a color filter before entering the diodes so that the current produced by each diode represents light from a monochromatic light source.

FIG. 1 is a schematic cross-sectional view of a conventional image-sensing device. As shown in FIG. 1, a plurality of photodiodes 102 are formed above a substrate 100 and a plurality of isolation structure 104 are formed on each side of each diode 102. A smoothing layer 106 and a color filter layer 108 are sequentially formed over the diodes 102 and the isolation structure 104. The color filter layer 108 is embedded within the smoothing layer 106, forming a sandwiched structure. A condensing lens layer 112 is formed over the smoothing layer 106. The condensing lens layer 112 consists of a plurality of micro-lenses.

A conventional image-sensing device utilizes the plurality of micro-lenses in the condensing lens layer 112 to increase image-sensing sensitivity and reduce smearing. In general, the micro-lenses on the condensing lens layer 112 are formed by performing a thermal-flow procedure. However, factors such as thermal-flow temperature and pressure are extremely difficult to control in a thermal-flow procedure. Furthermore, the micro-lenses are usually made from a photosensitive resin and hence material cost is relatively high. In addition, height 114 of each micro-lens must be greater than half-width 116 at the base of the micro-lens in order to obtain a higher imaging sensitivity. However, conventional melting process for forming the micro-lenses is likely to produce a half-width 116 much greater than micro-lens height 114 due to surface tension and much variation in their dimensions.

SUMMARY OF THE INVENTION

Accordingly, one object of the present invention is to provide a phase grating image-sensing device that can avoid the problems created by a conventional method of forming a condensing layer.

A second object of this invention is to provide a phase grating image sensing device that can lower production cost and decrease processing complexity considerably.

To achieve these and other advantages and in accordance with the purpose of the invention, as embodied and broadly described herein, the invention provides a phase grating image-sensing device. The device includes a plurality of photodiodes, a smoothing layer, a color filter layer and a plurality of phase gratings. The photodiodes are formed on a substrate and isolated from each other by isolation structures. The smoothing layer covers the photodiodes and the isolation structures. The color filter layer is embedded within the smoothing layer forming a sandwich structure with the smoothing layer. The phase gratings are formed over the smoothing layer positioned at corresponding locations above isolation structures. The phase grating layers produce a constructive interference of light passing through the smoothing layer.

This invention also provides an alternative phase grating image-sensing device. The device includes a plurality of photodiodes, a smoothing layer, a color filter layer and a plurality of phase gratings. The photodiodes are formed over a substrate and isolated from each other by isolation structures. The smoothing layer covers the photodiodes and the isolation structures. The phase gratings are embedded within the smoothing layer positioned at corresponding locations above isolation structures. The phase gratings produce a constructive interference of light passing through the smoothing layer. The color filter layer is formed on the upper surface of the smoothing layer.

This invention provides a method of forming a phase grating image-sensing device. A plurality of photodiodes is formed over a substrate. An isolation structure is formed between the various photodiodes for isolating the photodiodes from each other. A first smoothing layer is formed over the photodiodes and the isolation structures. A color filter layer is formed over the first smoothing layer. A second smoothing layer is formed over the color filter layer. Phase grating material is deposited over the second smoothing layer. The phase grating layer is patterned to form a plurality of phase gratings. The plurality of phase gratings causes a constructive interference of light passing to the color filter layer.

This invention also provides an alternative method of forming a phase-grating image-sensing device. A plurality of photodiodes is formed over a substrate. An isolation structure is formed in-between the various photodiodes for isolating the photodiodes from each other. A first smoothing layer is formed over the photodiodes and the isolation structures. Phase grating material is deposited over the second smoothing layer. The phase grating layer is patterned to form a plurality of phase gratings. A second smoothing layer is formed over the first smoothing layer and covering the phase gratings. A color filter layer is formed over the second smoothing layer. The plurality of phase gratings causes a constructive interference of light coming in from the color filter layer.

The phase gratings of this invention are fabricated using standard CMOS procedure. Since processing conditions are much easier to control, fewer and less complicated steps than forming conventional micro-lenses are required. In addition, distance between the phase gratings and the photodiodes as well as width/height ratio of the phase gratings is easier to control. Furthermore, the phase gratings are made from metallic material, thereby lowering the production cost considerably.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
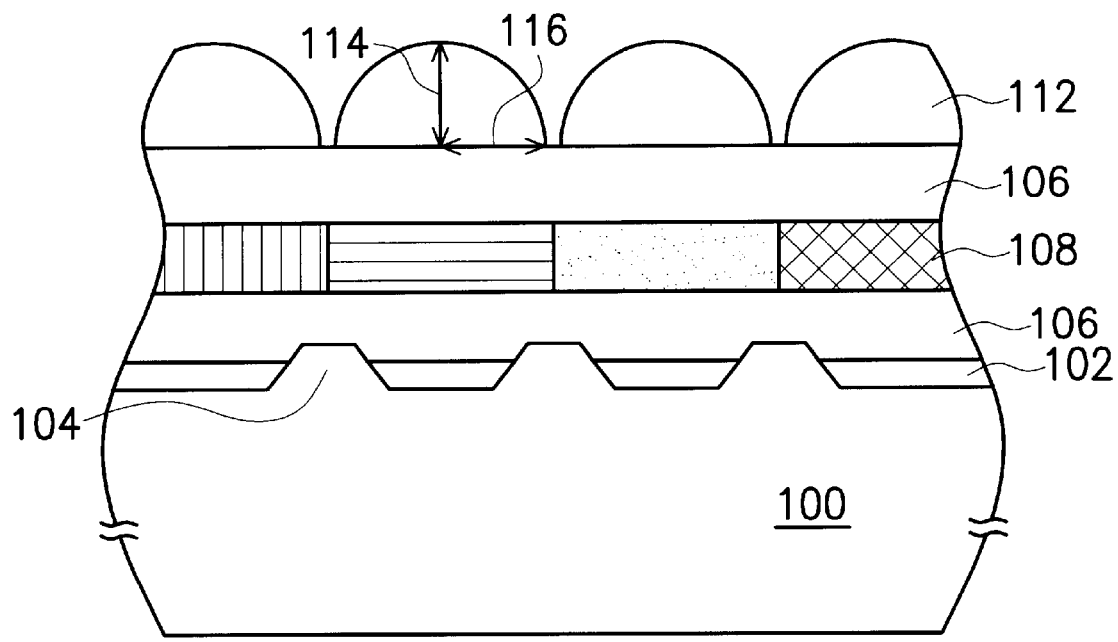
FIG. 1 is a schematic cross-sectional view of a conventional image-sensing device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
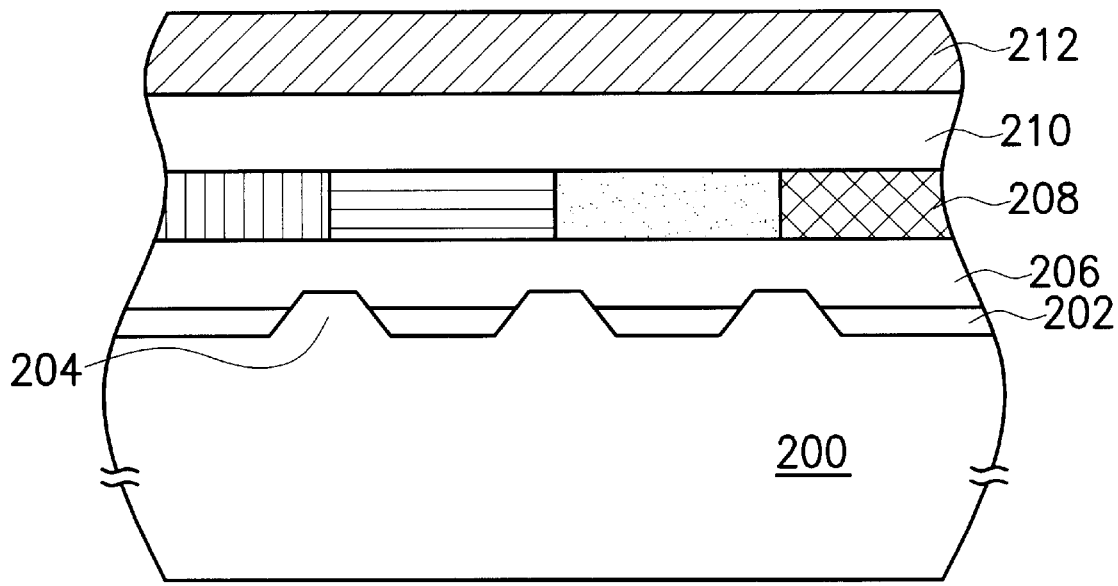
FIGS. 2A to 2C are schematic cross-sectional views showing the progression of steps for forming a phase grating image-sensing device according to a first preferred embodiment of this invention.
Figure 2B:
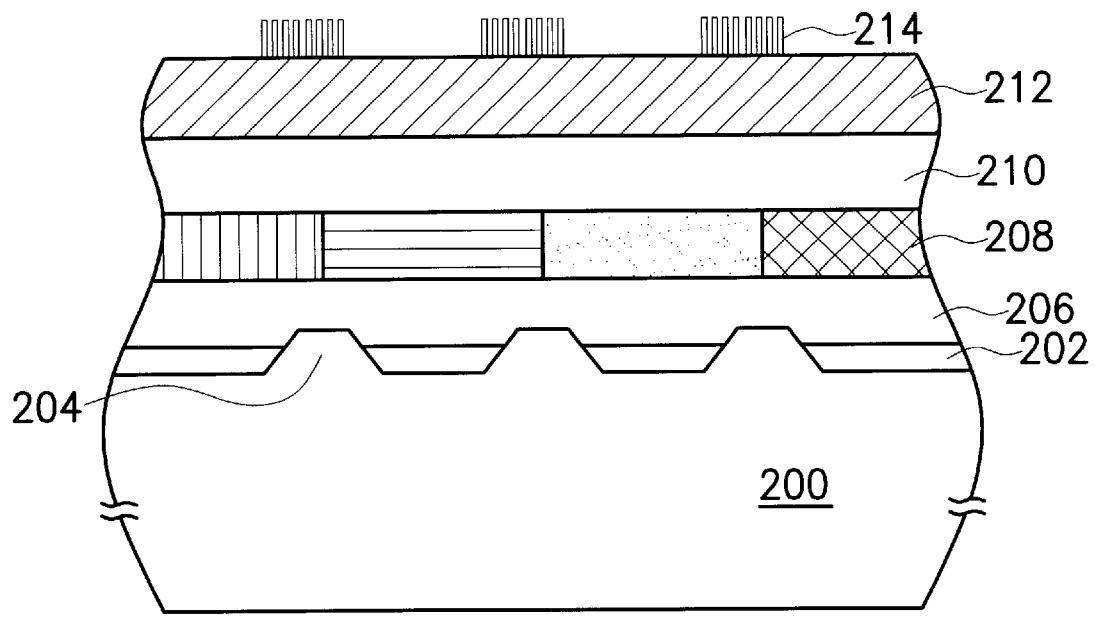
Figure 2C:
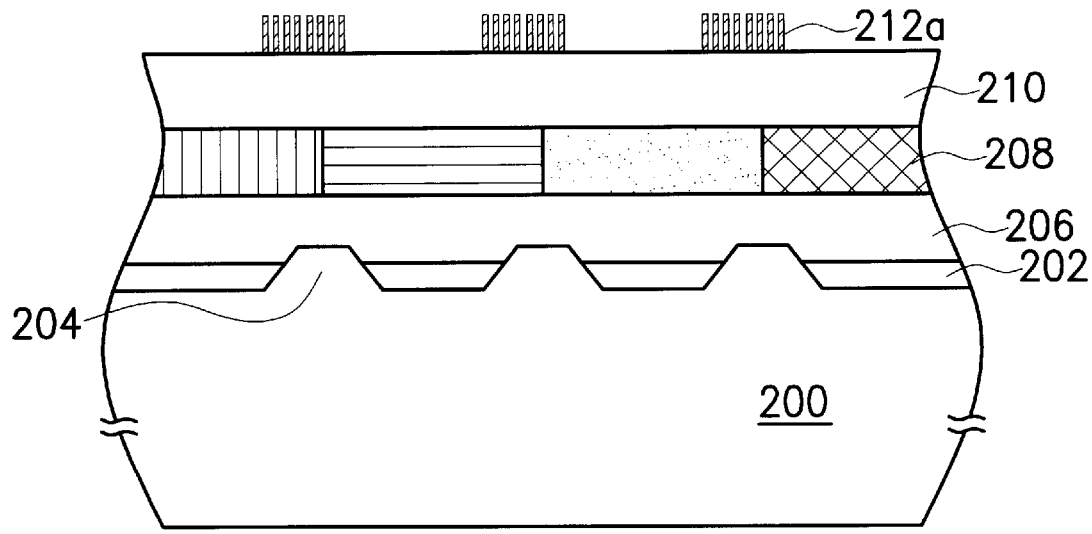

FIGS. 2A to 2C are schematic cross-sectional views showing the progression of steps for forming a phase grating image-sensing device according to a first preferred embodiment of this invention. As shown in FIG. 2A, a substrate having a plurality of photodiodes 202 thereon is provided. An isolation structures 204 is formed between the photodiodes 202. The isolation structure 204 is made from a material such as silicon oxide. A first smoothing layer 206 is formed over the photodiodes 202 and the isolation structures 204. The first smoothing layer 206 is made from a material such as silicon oxide or phosphosilicate glass. A color filter layer 208 is formed over the first smoothing layer 206. Thereafter, a second smoothing layer 210 is formed over the color filter layer 208. The second smoothing layer is formed from a material such as silicon oxide or phosphosilicate glass. The color filter layer 208 is sandwiched between the first smoothing layer 206 and the second smoothing layer 210. Phase grating material is deposited over the second smoothing layer 210 to form a phase grating layer 212. Phase grating material includes metallic materials, preferably a chromium material.

As shown in FIG. 2B, a patterned photoresist layer 214 is formed over the phase grating layer 212.

As shown in FIG. 2C, an etching of the phase grating layer 212 is conducted to form a plurality of phase gratings 212a. The phase gratings 212a are formed on the surface of the second smoothing layer 210 at corresponding locations above the isolation structures 204. The phase gratings 212a cause constructive interference of light passing through the second smoothing layer 210, the color filter layer 208 and the first smoothing layer 206 so that sensitivity of the imaging sensor is raised.

Figure 3:
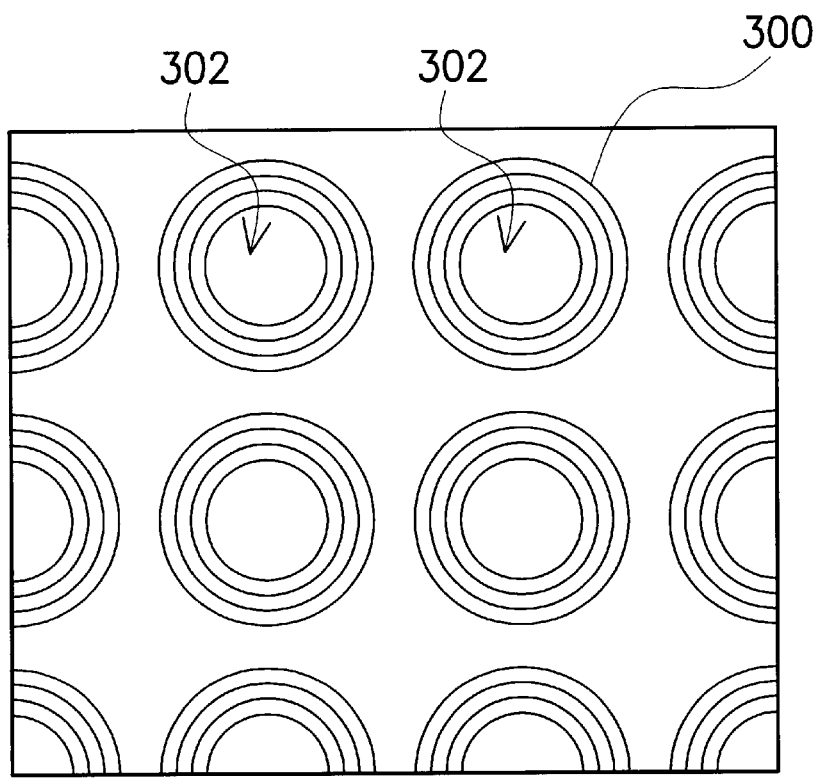
FIG. 3 is a schematic top view showing the phase gratings of the image-sensing device according to the first embodiment of this invention.

FIG. 3 is a schematic top view showing the phase gratings of the image-sensing device according to the first embodiment of this invention. In this invention, the plurality of phase gratings 212a encircles the fringes of the photodiodes 202. In other words, each phase grating 212a actually comprises a plurality of concentric rings around the photodiode 202. The innermost circle in each phase grating ring pattern represents the position of a photodiode.

Figure 4A:
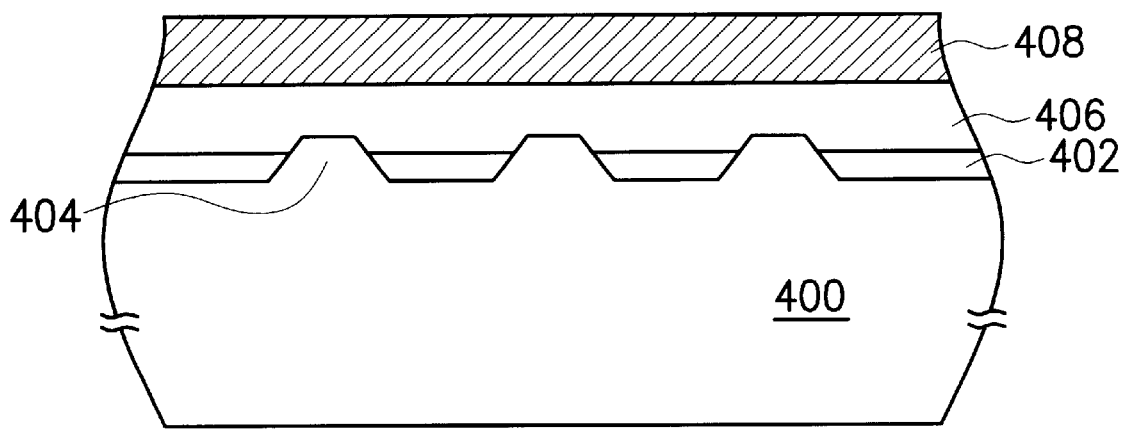
FIGS. 4A to 4C are schematic cross-sectional views showing the progression of steps for forming a phase grating image-sensing device according to a second preferred embodiment of this invention.
Figure 4B:
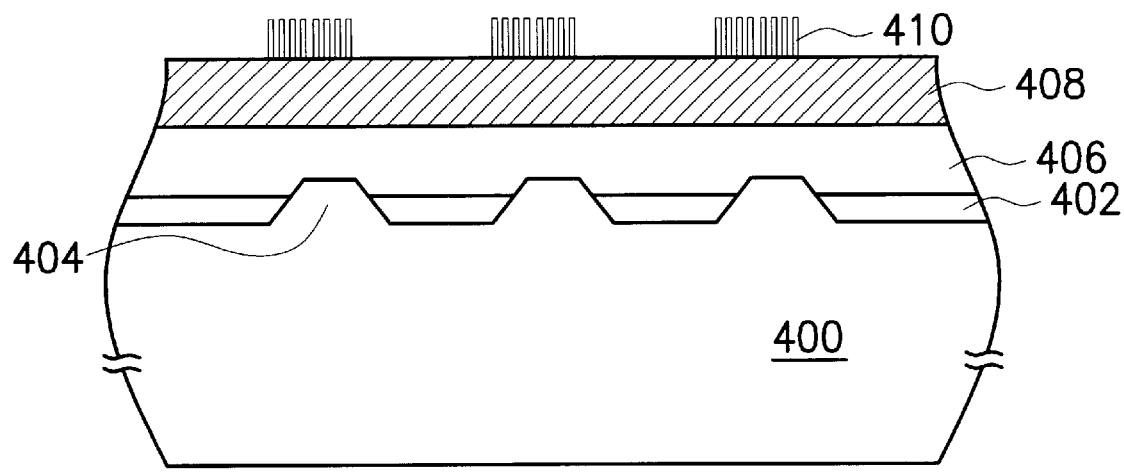
Figure 4C:
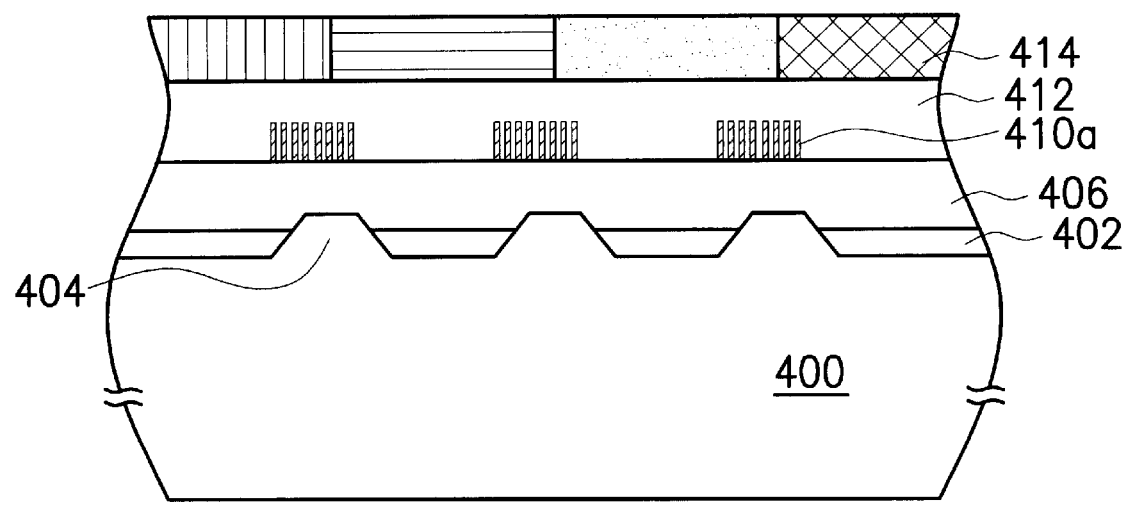

FIGS. 4A to 4C are schematic cross-sectional views showing the progression of steps for forming a phase grating image-sensing device according to a second preferred embodiment of this invention. As shown in FIG. 4A, a substrate having a plurality of photodiodes 402 thereon is provided. Isolation structures 404 are formed between the photodiodes 202. The isolation structure 404 is made from a material such as silicon oxide. A first smoothing layer 406 is formed over the photodiodes 402 and the isolation structures 404. The first smoothing layer 406 is made from a material such as silicon oxide or phosphosilicate glass. Phase grating material is deposited over the first smoothing layer 406 to form a phase grating layer 408. Phase grating material includes metallic materials, preferably a chromium material.

As shown in FIG. 4B, a patterned photoresist layer 410 is formed over the phase grating layer 408.

As shown in FIG. 4C, an etching of the phase grating layer 408 is conducted to form a plurality of phase gratings 410a. The phase gratings 410a are formed as concentric rings around the photodiodes 402. In other words, each phase grating 410a actually comprises a pattern of concentric rings around the photodiode 202. A top view of the phase gratings 410a is identical to the ones shown in FIG. 3. The innermost circle in each phase grating ring pattern represents the position of a photodiode.

A second smoothing layer 412 is formed over the first smoothing layer 406. The second smoothing layer 406 covers the plurality of phase gratings 410a so that phase gratings 410a are embedded within the second smoothing layer 406 at corresponding locations relative to the isolation structures 404. The second smoothing layer 412 is formed from a material such as silicon oxide or phosphosilicate. A color filter layer 414 is formed over the second smoothing layer 412. The phase gratings 410a cause a constructive interference of light passing through the color filter layer 414, the second smoothing layer 412 and the first smoothing layer 406 so that sensitivity of the imaging sensor is raised.

The phase gratings of this invention may be formed over the smoothing layer or within the smoothing layer to increase sensor sensitivity.

In conclusion, the advantages of this invention include:

1. The phase gratings of this invention are fabricated using standard CMOS procedure. Since processing conditions are much easier to control, fewer and less complicated steps than forming conventional micro-lenses are required.

2. The phase gratings are formed by etching. Hence, distance between the phase gratings and the photodiodes as well as width/height ratio of the phase gratings are easier to control.

3. The phase grating is made from a metallic material. Therefore, production cost is much lower than forming conventional micro-lenses using expensive resinous material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase grating imaging sensor, comprising:
   a plurality of photodiodes on a substrate;
   an isolation structure between every pair of neighboring photodiodes to isolate the photodiodes from each other;
   a smoothing layer over the photodiodes and the isolation structures;

a color filter layer embedded within the smoothing layer and forming a sandwiched structure; and a plurality of phase gratings on a surface of the smoothing layer at corresponding locations relative to the isolation structures, wherein the phase gratings cause a constructive interference of light passing through the smoothing layer.

2. The imaging sensor of claim 1, wherein the phase gratings are positioned on the surface of the smoothing layer at corresponding locations relative to the isolation structures surrounding a periphery of the photodiodes.

3. The imaging sensor of claim 2, wherein each phase grating comprises a pattern of concentric rings that surrounds the periphery of the photodiode.

4. The imaging sensor of claim 3, wherein the phase gratings are made of a metal.

5. The imaging sensor of claim 4, wherein the phase gratings are made of chromium.

6. The imaging sensor of claim 1, wherein the phase gratings are made of a metal.

7. The imaging sensor of claim 6, wherein the phase gratings are made of chromium.

8. The imaging sensor of claim 1, wherein a smoothing layer material is selected from a group consisting of silicon oxide and phosphosilicate glass.

9. The imaging sensor of claim 1, wherein the smoothing layer further includes:

a first smoothing layer that covers the photodiodes and the isolation structures in contact with one surface of the color filter layer; and a second smoothing layer that covers another surface of the color filter layer.

10. A phase grating imaging sensor, comprising:

a plurality of photodiodes on a substrate;

an isolation structure between every pair of neighboring photodiodes to isolate the photodiodes from each other;

a smoothing layer over the photodiodes and the isolation structures;

a color filter layer over the smoothing layer; and a plurality of phase gratings within a surface of the smoothing layer at corresponding locations relative to the isolation structures, wherein the phase gratings cause a constructive interference of light passing through the color filter layer.

11. The imaging sensor of claim 10, wherein the phase gratings are positioned within the smoothing layer at corresponding locations relative to the isolation structures surrounding a periphery of the photodiodes.

12. The imaging sensor of claim 11, wherein each phase grating comprises a pattern of concentric rings that surrounds the periphery of the photodiode.

13. The imaging sensor of claim 12, wherein the phase gratings are made of a metal.

14. The imaging sensor of claim 13, wherein the phase gratings are made of chromium.

15. The imaging sensor of claim 10, wherein the phase gratings are made of a metal.

16. The imaging sensor of claim 15, wherein the phase gratings are made of chromium.

17. The imaging sensor of claim 10, wherein a smoothing layer material is selected from a group consisting of silicon oxide and phosphosilicate glass.

18. A method of forming a phase grating image-sensing device, comprising:

forming a plurality of photodiodes on a substrate;

forming an isolation structure between neighboring photodiodes to isolate the photodiodes from each other;

forming a first smoothing layer over the photodiodes and the isolation structures;

forming a color filter layer over the first smoothing layer;

forming a second smoothing layer over the color filter layer;

forming a phase grating layer over the second smoothing layer; and patterning the phase grating layer to form a plurality of phase gratings, wherein the phase gratings cause a constructive interference of light passing through the color filter layer.

19. The method of claim 18, wherein patterning the phase grating layer includes conducting a photolithographic and an etching process to form phase gratings at locations corresponding to the isolation structures and encircling a periphery of the photodiodes.

20. The method of claim 19, wherein the phase grating layer is patterned into a plurality of phase grating having a concentric pattern around each photodiode.

21. The method of claim 18, wherein the phase grating layer is made of a metal.

22. The method of claim 21, wherein the phase grating layer is made of chromium.

23. A method of forming a phase grating image-sensing device, comprising:

forming a plurality of photodiodes on a substrate;

forming an isolation structure between neighboring photodiodes to isolate the photodiodes from each other;

forming a first smoothing layer over the photodiodes and the isolation structures;

forming a phase grating layer over the first smoothing layer;

patterning the phase grating layer to form a plurality of phase gratings;

forming a second smoothing layer over the first smoothing layer so that the phase gratings are covered; and forming a color filter layer over the second smoothing layer, wherein the phase gratings cause a constructive interference of light passing through the color filer layer.

24. The method of claim 23, wherein patterning the phase grating layer includes conducting a photolithographic and an etching process to form phase gratings at locations corresponding to the isolation structures and encircling a periphery of the photodiodes.

25. The method of claim 24, wherein the phase grating layer is patterned into a plurality of phase grating having a concentric pattern around each photodiode.

26. The method of claim 23, wherein the phase grating layer is made of a metal.

27. The method of claim 26, wherein phase grating layer is made of chromium.

* * * * *